(12) United States Patent
Hekmatshoartabari et al.

(10) Patent No.: US 10,199,524 B2
(45) Date of Patent: Feb. 5, 2019

(54) FIELD-EFFECT PHOTOVOLTAIC ELEMENTS

(75) Inventors: Bahman Hekmatshoartabari, White Plains, NY (US); Devendra K. Sadana, Pleasantville, NY (US); Wilfried E. Haensch, Somers, NY (US); Ghavam G. Shahidi, Pound Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 1563 days.

(21) Appl. No.: 13/350,735

(22) Filed: Jan. 13, 2012

(65) Prior Publication Data
US 2013/0180564 A1 Jul. 18, 2013

(51) Int. Cl.
*H01L 31/075* (2012.01)
*H01L 31/0224* (2006.01)
(Continued)

(52) U.S. Cl.
CPC .... *H01L 31/075* (2013.01); *H01L 31/022433* (2013.01); *H01L 31/062* (2013.01);
(Continued)

(58) Field of Classification Search
CPC ........... H01L 31/0684; H01L 31/02245; H01L 31/022458; H01L 31/11; H01L 31/112; H01L 31/1126; H01L 31/1105; H01L 27/142; H01L 31/068; H01L 31/0682; H01L 31/077; H01L 31/0445; H01L 31/02005; H01L 31/02008; H01L 31/113; H01L 31/1133; H01L 31/1136; H01L 31/022441; H01L 31/075; H01L 27/0142;
(Continued)

(56) References Cited

U.S. PATENT DOCUMENTS 3,265,899 A * 8/1966 Bergstrom .............. H01L 31/00
257/458
4,451,838 A * 5/1984 Yamazaki ......... H01L 31/03921
136/258
(Continued)

FOREIGN PATENT DOCUMENTS

JP 09199742 A * 7/1997 ....... H01L 31/02008

OTHER PUBLICATIONS

JP 09199742 English machine translation.*
(Continued)

*Primary Examiner* — Jeffrey T Barton
*Assistant Examiner* — Andrew J Golden
(74) *Attorney, Agent, or Firm* — L. Jeffrey Kelly; Otterstedt, Ellenbogen & Kammer, LLP

(57) ABSTRACT

Photovoltaic devices such as solar cells having one or more field-effect hole or electron inversion/accumulation layers as contact regions are configured such that the electric field required for charge inversion and/or accumulation is provided by the output voltage of the photovoltaic device or that of an integrated solar cell unit. In some embodiments, a power source may be connected between a gate electrode and a contact region on the opposite side of photovoltaic device. In other embodiments, the photovoltaic device or integrated unit is self-powering.

16 Claims, 14 Drawing Sheets

(51) Int. Cl.
*H01L 31/062* (2012.01)
*H01L 31/113* (2006.01)
*H01L 31/076* (2012.01)

(52) U.S. Cl.
CPC ........ *H01L 31/076* (2013.01); *H01L 31/1133* (2013.01); *Y02E 10/548* (2013.01)

(58) Field of Classification Search
CPC ............. H01L 33/0041; H01L 29/7391; H01L 29/7393
USPC .................................................. 136/243–265
See application file for complete search history.

(56) References Cited

U.S. PATENT DOCUMENTS

| | | | | |
|---|---|---|---|---|
| 4,766,471 | A | * | 8/1988 | Ovshinsky ............ H01L 31/113 250/551 |
| 5,006,180 | A | * | 4/1991 | Kanai .................. H01L 31/0368 136/249 |
| 5,215,599 | A | * | 6/1993 | Hingorani ............. H01L 27/142 136/255 |
| 5,911,839 | A | * | 6/1999 | Tsai .................. H01L 31/03042 136/262 |
| 6,081,017 | A | * | 6/2000 | Kim et al. ..................... 136/256 |
| 2010/0108138 | A1 | * | 5/2010 | Smith et al. .................. 136/256 |
| 2010/0154876 | A1 | * | 6/2010 | Camalleri et al. ............ 136/255 |

OTHER PUBLICATIONS

Nobuyuki Matsuki et al., Field-effect a-Si:H solar cells with transparent conductive oxide comb-shaped electrodes, Thin Solid Films 486 (2005) 210-213.

G. De Cesare et al., Experimental realization of field effect a-Si:H solar cells, Thin Sold Films 427 (2003) 166-170.

G.C. Salter et al, Silicon solar cells using natural inversion layers found in thermally-oxidized p-silicon, Solid State Electronics,1977, vol. 20, pp. 95-104, Pergamon Press,UK.

Kaori Miyazaki et al., Device simulation and fabrication of field effect solar cells, Bull. Mater. Sci., vol. 22, No. 3, May 1999, pp. 729-733, Indian Academy of Sciences.

Nobuyuki Matsuki et al, Concept and performance of a field-effect amorphous silicon solar cell, Semicond. Sci. Technol. 19 (2004)61-64, Institute of Physics Publishing Ltd.UK.

H. Fujioka et al., Field Effect Solar Cell, Future Generation Photovoltaic Technologies: First NREL Conference, edited by McConnell (1997), The American Institute of Physics.

H. Fujioka et al., Characteristics of field effect a-Si:H solar cells, Journal of Non-Crystalline Solids 227-230 (1998) 1287-1290, Elsevier Science B.V.

* cited by examiner

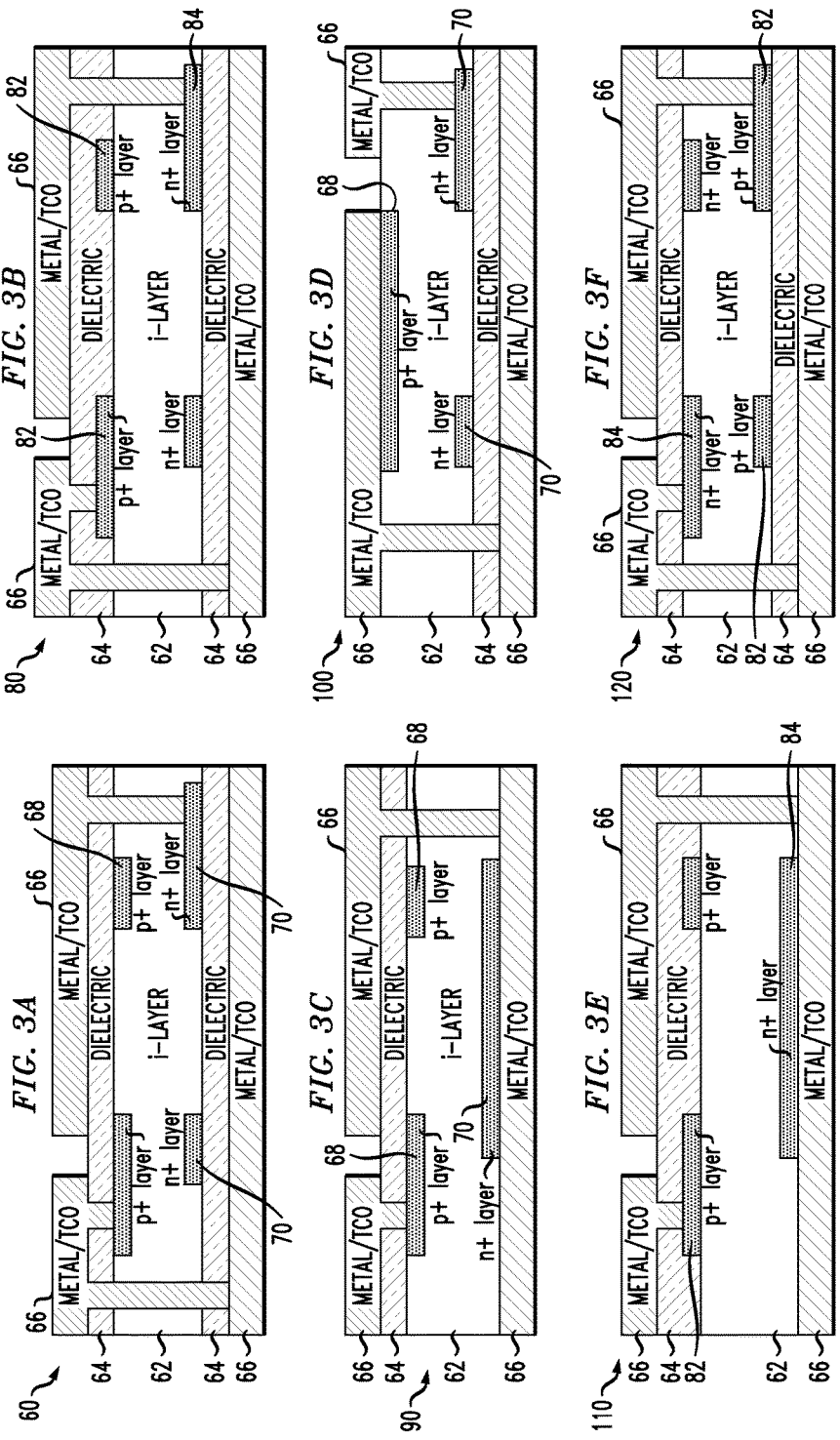

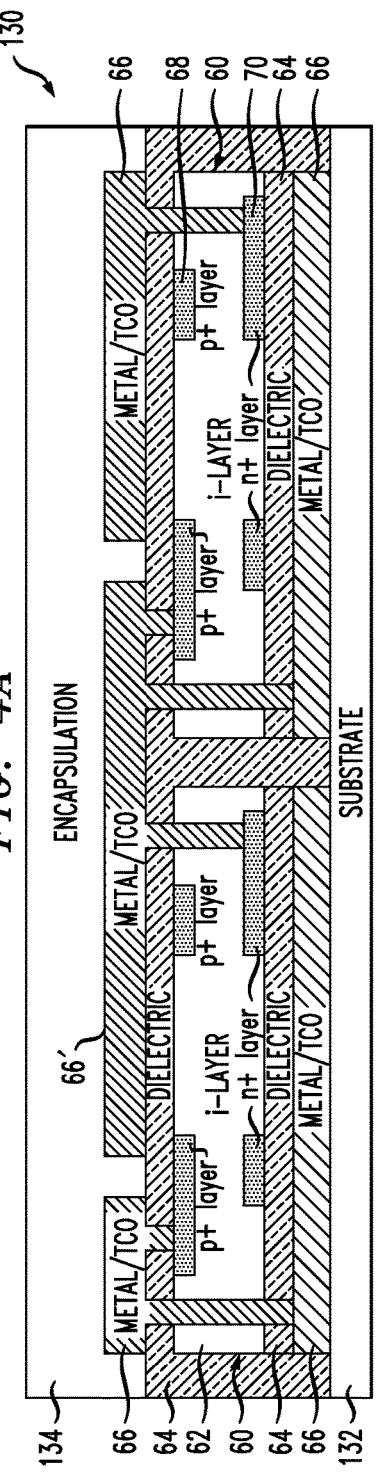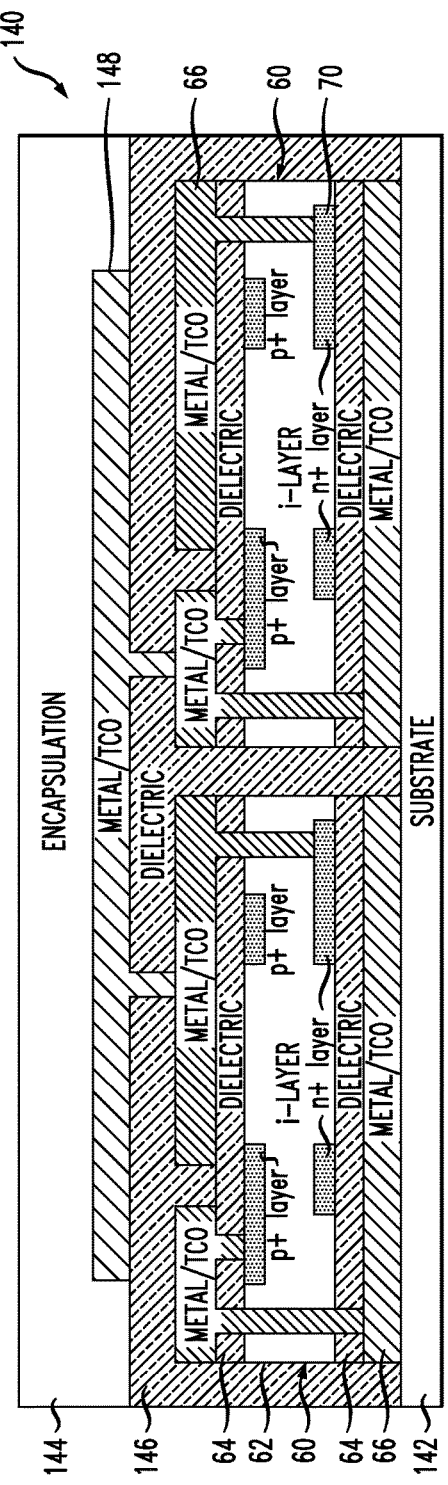

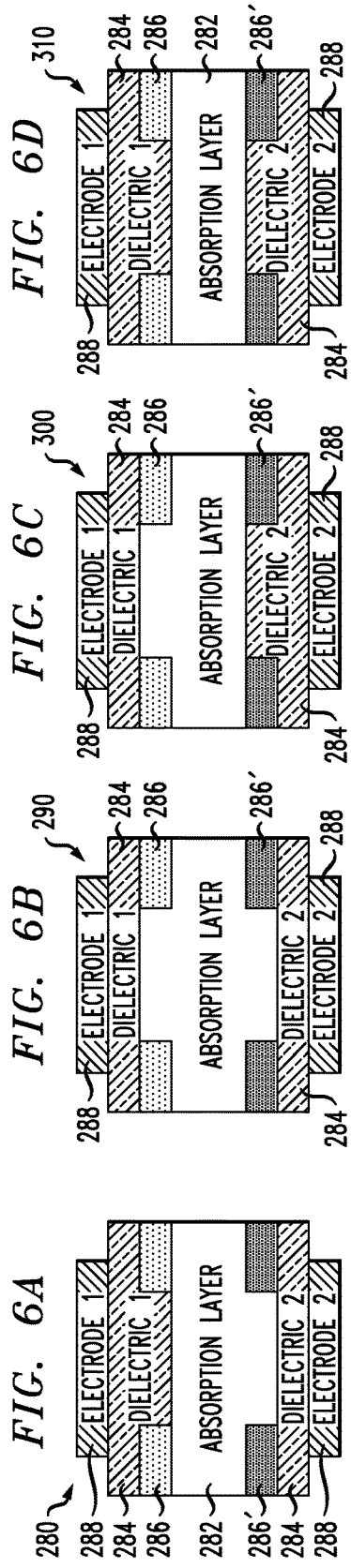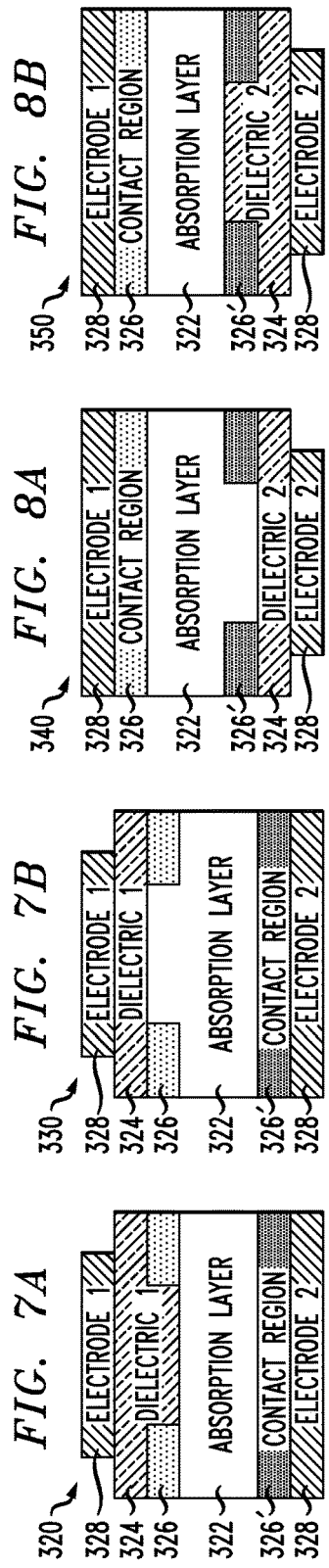

CR = CONTACT REGION
ELCT = ELECTRODE

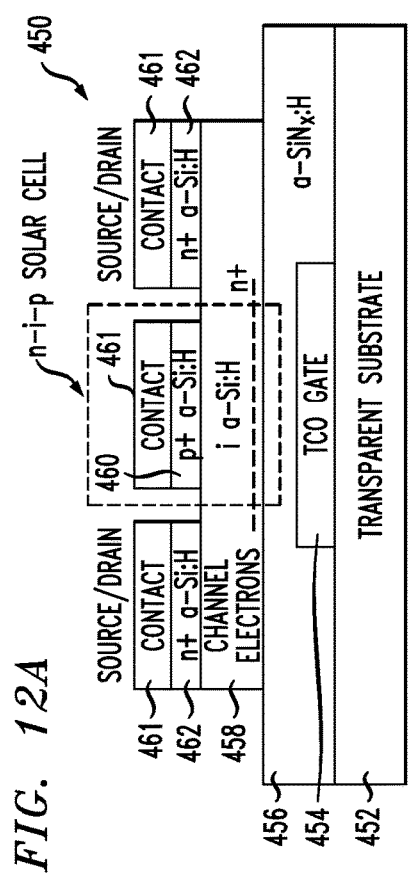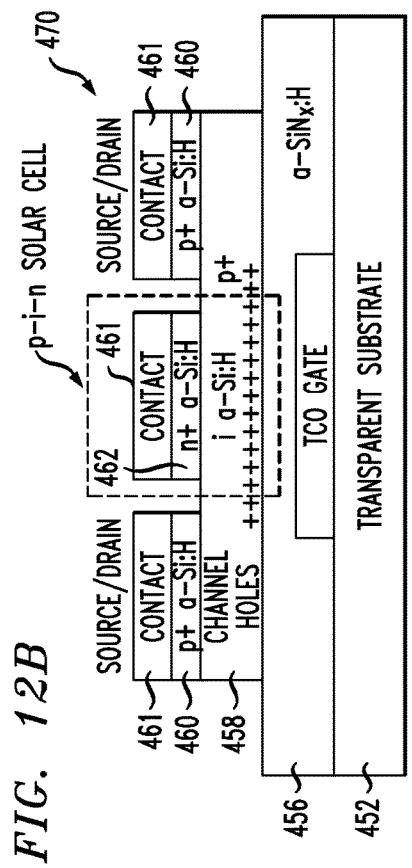
FIG. 12A  FIG. 13A
FIG. 12B  FIG. 13B

FIELD-EFFECT PHOTOVOLTAIC ELEMENTS

FIELD OF THE INVENTION

The present invention relates to the physical sciences, and, more particularly, to photovoltaic structures having one or more contacts comprised of a field-effect hole or electron inversion/accumulation layer.

BACKGROUND OF THE INVENTION

Field-effect solar cells using crystalline silicon (c-Si) and hydrogenated amorphous silicon have been developed. In such cells, the doped contact layers (p+ or n+) in conventional p+-n or p-i-n structures are replaced with field-effect inversion/accumulation charge layers. This is beneficial for solar cells based on thin-film materials such as a-Si:H with low doping efficiency (and therefore limited separation of quasi-Fermi levels) and poor diffusion length in the doped layers. Using the inversion layer instead of the doped layer can improve (i) the open-circuit voltage ($V_{oc}$) of the cells by increasing the separation of the quasi-Fermi levels, and (ii) the short-circuit current ($J_{sc}$) of the cells by eliminating light absorption in the doped layers. The solar cells described above involve using an external power supply or a dielectric fixed charge for inducing electronic charge in the contact region.

An amorphous silicon thin-film transistor (a-Si:H TFT) 20 is shown in FIG. 1. This type of transistor has a wide variety of uses, including in TFT/LCD displays and in the production of x-ray medical imagers. The transistor includes a substrate 22 adjoined by a gate metal 24 and a layer 25 of a-SiN$_x$:H. An intrinsic amorphous hydrogenated silicon layer 26 adjoins the a-SiN$_x$:H layer. A pair of doped, amorphous hydrogenated silicon contact regions 28, 30 (n+ a-Si:H) adjoin the intrinsic layer 26.

An amorphous silicon p-i-n solar cell 40 is shown in FIG. 2. This exemplary structure includes a substrate 42, a transparent conductive layer 44 (a TCO in the exemplary structure), a p+ amorphous hydrogenated silicon layer 46, an intrinsic amorphous hydrogenated silicon semiconductor layer 48, and a n+ a-Si:H contact region 50. The poor quality of doped contacts in amorphous materials (low doping efficiency, high defect density and relatively strong light) limit efficiency of the structure.

SUMMARY OF THE INVENTION

Principles of the invention provide solar cell structures in which the electric field required for charge inversion and/or accumulation at the contact region(s) is provided by the output voltage of the solar cell or that of an integrated solar cell unit. In one aspect, an exemplary structure includes an absorption layer having first and second sides, a dielectric layer in direct contact with the first side of the absorption layer, and at least one first contact region in direct contact with the dielectric layer and the absorption layer. A first electrode is in direct contact with the dielectric layer, the first electrode being highly electrically conductive. A second contact region is in direct contact with the second side of the absorption layer, one of the first and second contact regions being low work-function with respect to the absorption layer and the other of the first and second contact regions being high work-function with respect to the absorption layer. The first electrode is electrically connected to the second contact region. A second electrode on the second side of the absorption layer is in direct contact with the second contact region, the second electrode being highly electrically conductive.

A photovoltaic structure is provided in accordance with a further exemplary embodiment of the invention. The structure includes an absorption layer having first and second sides, a first dielectric layer in direct contact with the first side of the absorption layer, a second dielectric layer in direct contact with the second side of the absorption layer, and a first contact region in direct contact with the first dielectric layer and the absorption layer. A first electrode is in direct contact with the first dielectric layer, the first electrode being highly electrically conductive. A second contact region is in direct contact with the second dielectric layer and the absorption layer. One of the first and second contact regions is low work-function with respect to the absorption layer. The other of the first and second contact regions is high work-function with respect to the absorption layer. The first electrode is electrically connected to the second contact region. A second electrode is on the second side of the absorption layer and is in direct contact with the second dielectric region. The second electrode is highly electrically conductive and electrically connected to the first contact region.

A photovoltaic structure in accordance with another exemplary embodiment includes an absorption layer and a dielectric layer in direct contact with the absorption layer. One or more high work-function contact regions are in direct contact with the absorption layer and one or more low work-function contact regions are in direct contact with the absorption layer. A gate electrode is in direct contact with the dielectric layer and electrically connected to one of the contact regions. A first terminal is connected to one of the one or more high work-function contact regions and a second terminal is connected to one of the one or more low work-function contact regions. A gate terminal is connected to the gate electrode.

A photovoltaic circuit in accordance with a further exemplary embodiment of the invention includes a plurality of solar cell devices, each solar cell device comprising an absorption layer, a dielectric layer in direct contact with the absorption layer, one or more high work-function contact regions in direct contact with the absorption layer, and one or more low work-function contact regions in direct contact with the absorption layer. The photovoltaic circuit further includes a gate electrode in direct contact with the dielectric layer and electrically connected to one of the contact regions, a first terminal connected to one of the one or more high work-function contact regions, a second terminal connected to one of the one or more low work-function contact regions, and a gate terminal connected to the gate electrode. The solar cell devices are electrically connected in series wherein the gate terminal of at least one of the solar cell devices is electrically connected to one of the first and second terminals of another of the solar cell devices. A power supply may be electrically connected between the gate terminal of at least one of the solar cell devices and one of the first and second terminals of another of the solar cell devices.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

Photovoltaic device can be self-powered;
Principles of invention applicable to any thin-film or bulk technology;
Both p+ and n+ contacts can be on the back side of a cell, reducing absorption loss;
Inverted or accumulated channel equivalent to a highly doped material without defect creation due to defect-dopant coupling;
Negligible band-gap narrowing and Auger recombination;
Higher open circuit voltage and higher fill factor (FF) expected;
In the case of a-Si:H, compatible with TFT technology for TFT/LCD backplanes;
Availability of TFTs and solar cells allows for integrated smart circuits;
Series connection of cells, if employed, allows increased module output voltage.
In the case of III-V materials, epitaxial growth may be eliminated by utilizing an inverted channel instead of an epitaxially grown highly doped layer.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 3A-3J show exemplary field-effect solar cell structures in accordance with the invention;

FIGS. 4A and 4B show exemplary monolithic integration schemes for the solar cell structure of FIG. 3A;

FIGS. 6A-6D show exemplary photovoltaic double-gated field-effect solar cell structures according to the invention;

FIGS. 7A and 7B show exemplary photovoltaic single-gated field-effect solar cell structures according to the invention wherein the gate electrode is at the top of the structure;

FIGS. 8A-8H show exemplary photovoltaic single-gated field-effect solar cell structures according to the invention;

FIG. 12A shows a TFT photovoltaic structure in accordance with the invention that includes a n-i-p solar cell;

FIG. 12B shows a TFT photovoltaic structure in accordance with the invention that includes a p-i-n solar cell;

FIGS. 13A-13C show exemplary solar cell layouts for TFT solar cell devices;

DETAILED DESCRIPTION OF PREFERRED EMBODIMENTS

Figure 1:
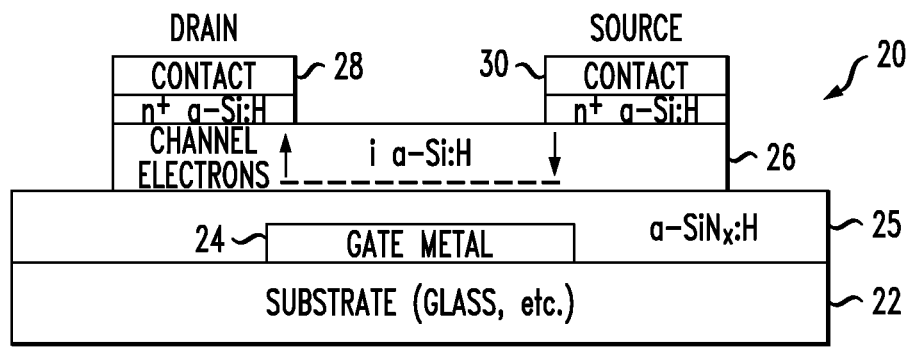
FIG. 1 shows an exemplary prior art amorphous silicon thin-film transistor.

Solar cell structures are disclosed in which the electric field required for charge inversion and/or accumulation at the contact regions of the solar cell structures is provided by the output voltage of the solar cell or that of an integrated solar cell unit. Solar cell structures including a battery connected between a gate electrode and source/drain terminal on the opposite sides of a device are provided in accordance with a further aspect of the invention.

FIG. 3A shows an exemplary solar cell structure 60 having two field-effect contact regions. The structure 60 includes an intrinsic semiconductor layer 62 that functions as an absorption layer and two dielectric layers 64, each adjoining one side of the intrinsic semiconductor layer. A metal or transparent conductive material such as a transparent conductive oxide (TCO) layer 66 adjoins each dielectric layer 64. In the embodiment of FIG. 3A, p+ and n+ contact regions 68, 70 are formed in the intrinsic layer 62. The metal or TCO layers 66 function as electrodes. An optional metal grid or blanket metal layer may be present on top of the TCO to increase the conductivity of the electrode (not shown). One of the electrodes is directly connected to one of the contact regions 68 on the opposite side of the intrinsic layer 62 while another of the electrodes is directly connected to another 70 of the contact regions on the side of the intrinsic layer 62 opposite thereto.

Figure 3G:
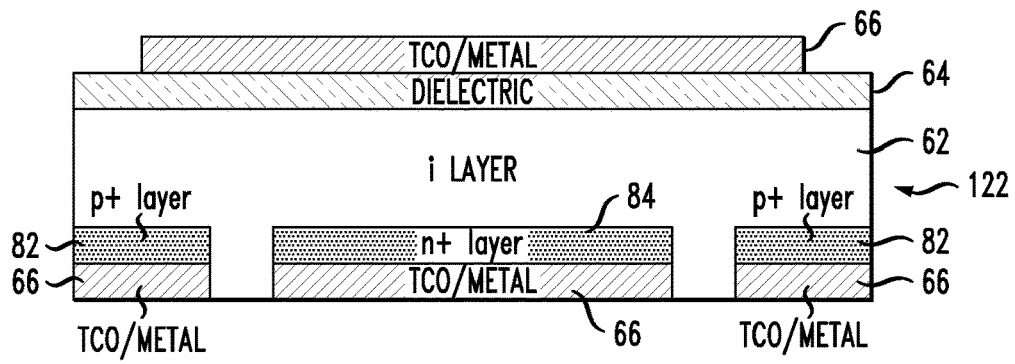

FIGS. 3B-3J show alternative embodiments of the invention having different numbers of field-effect contact regions and/or p+ and n+ regions formed by deposition rather than doping. The same reference numerals are employed to designate elements common to FIGS. 3A-3J. Referring to FIG. 3B, the structure 80 is identical to that shown in FIG. 3A except the p+ and/or n+ contact regions 82, 84 are formed by deposition rather than doping the intrinsic layer 62. The layers in this embodiment are deposited from bottom to top.

In the embodiments of FIGS. 3C and 3D, only one of the contact regions is configured as a field-effect structure. In other words, only one of the contact regions of these structures 90, 100 is configured such that the electric field required for charge inversion and/or accumulation at the contact region is provided by the output voltage of the solar cell structure. Only one dielectric layer 64 is provided in each structure. For example, only the bottom contact is field-effect in the structure 100 shown in FIG. 3D. The solar cell structure 110 shown in FIG. 3E is a one-sided structure having only one dielectric layer 64 wherein the doped layers are deposited. In the exemplary, one-sided structures 90, 100, 110 of FIGS. 3C, 3D and 3E, respectively, the TCO/metal layer on the field-effect side of the structure is in electrical contact with the doped contact layer on the conventional (i.e., non-field-effect) side of the structure via the metal/TCO contact layer on the conventional side of the structure. However, in some embodiments, the TCO/metal layer on the field-effect side of the structure spay be in direct contact with the doped contact layer on the conventional side of the structure. In other words, since the bottom n+ layers and bottom metal/TCO layers in these structures are directly connected to each other, the top metal/TCO layer can be directly connected to the bottom n+ layer, the bottom metal/TCO layer, or both. In some cases it may be advantageous to connect the top metal/TCO layer directly to the bottom metal/TCO layer to reduce the internal series resistance of the structure. This is true for most amorphous materials as the conductivity of the doped layers comprised of these materials is poor. Large area contacts to the doped regions may therefore be preferred over small area contacts to reduce the contact resistance. (A via contact is generally a small area contact and results in high contact resistance, but a via contact between two metal/TCO layers functions satisfactorily because these layers are highly conductive.)

FIG. 3F shows a solar cell structure 120 having deposited n+ contact regions and dielectric layers 64 respectively adjoining each side of the intrinsic semiconductor layer 62.

Figure 3H:
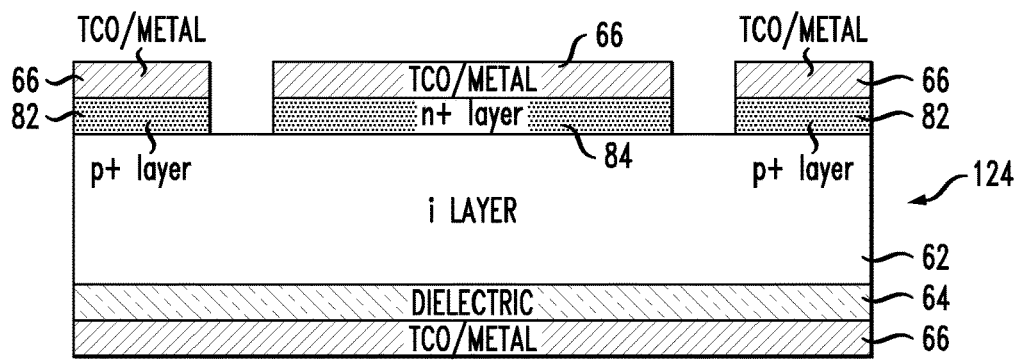
Figure 3I:
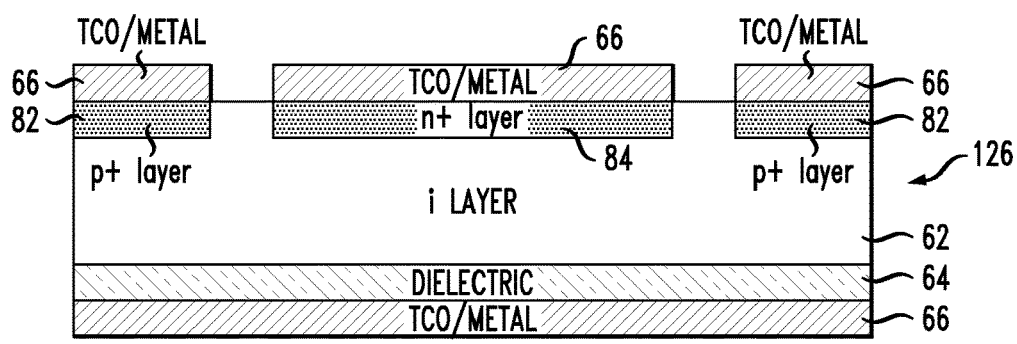
Figure 3J:
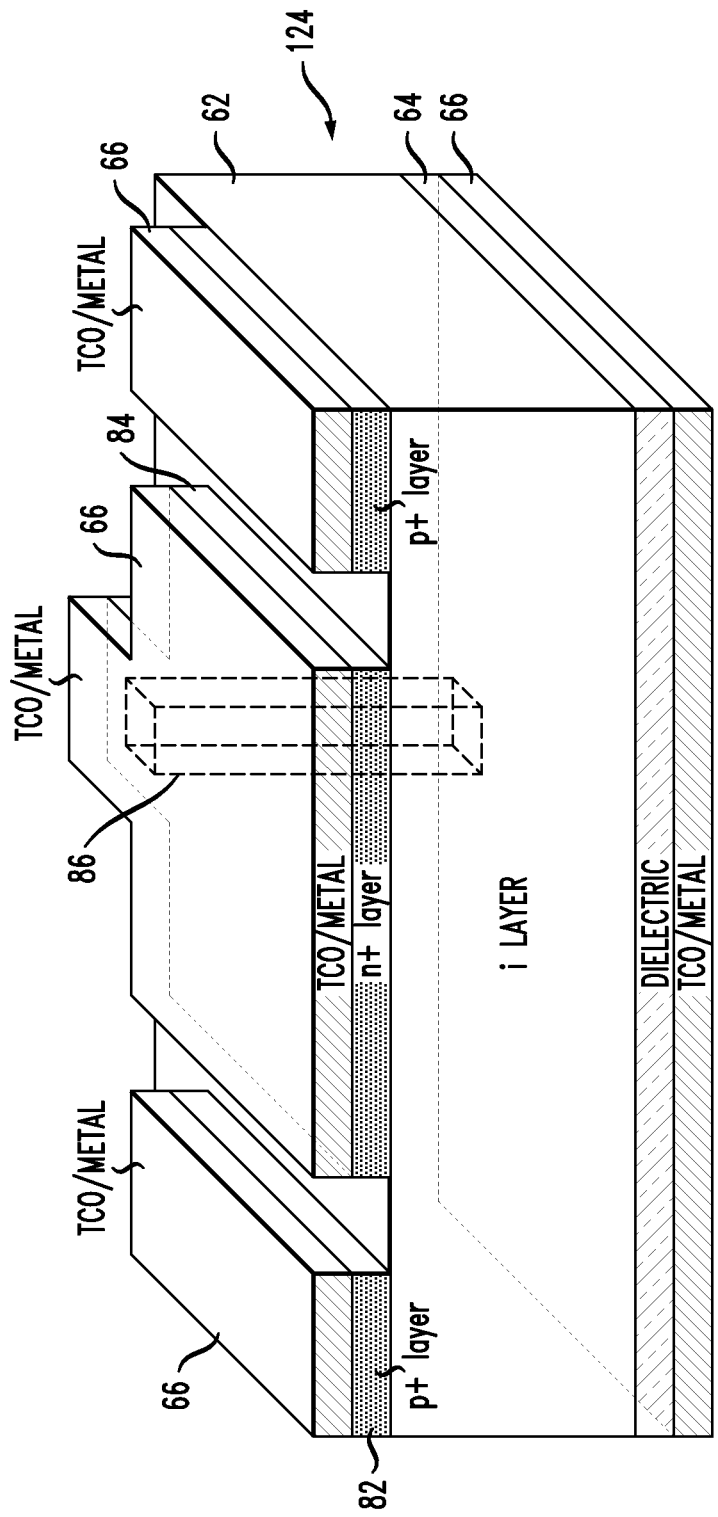

FIGS. 3G, 3H AND 3I illustrate exemplary solar cell structures 122, 124 and 126, respectively, with p+ contact regions 82 and n+ contact regions 84 on the same side of the absorption layer 62. In all three embodiments, layers are formed from bottom to top. (The substrate layer is not shown in these FIGURES.) In FIGS. 3G and 3H, the contact regions are deposited on top of the intrinsic layer 62. In FIG. 3I, the contact regions are doped into the intrinsic layer, for example by diffusion. It will be appreciated that it is possible to provide one of the contact regions by deposition and the other(s) by doping though a structure made using such a combination of techniques is not shown in the drawings. Contact vias, though present, are not shown in FIGS. 3G, 3H and 3I. FIG. 3J is a three dimensional, schematical illustration of the solar cell structure 124 shown in FIG. 3H. A contact via 86 electrically connecting the bottom surface of the top TCO/metal layer 66 and the top surface of the bottom TCO/metal layer 66 is shown in dashed lines.

The p+ and n+ contact regions described in the exemplary embodiments of FIGS. 3A-3J may be homogeneous (i.e. comprised of the same material as the intrinsic semiconductor layer) or heterogeneous. Schottky contact regions may be employed. The contact regions may alternatively comprise ambipolar contacts which are capable of injecting both electrons and holes into the channel depending on the electrical potential of the channel which is controlled by the gate. While undesirable for a conventional transistor as such a transistor could not effectively be turned off, this is not a problem for the field-effect solar cells as provided by the present invention. One non-limiting example of an ambipolar contact is silver on a-Si:H. The open circuit voltage of the solar cells (with a well-known theoretical upper limit of the intrinsic layer bandgap) must be sufficiently higher than the difference between the threshold voltage for electrons ($V_{tn}$) and the threshold voltage for holes ($V_{tp}$) in the intrinsic semiconductor layer (i.e. $V_{tn}-V_{tp}$) in the cases of two-sided field-effect structures (note always $V_{tn} > V_{tp}$), and sufficiently higher than the respective threshold voltage for electrons ($V_{tn}$) or holes ($-V_{tp}$) in the one-sided structures, to assure the formation of electron and/or hole inversion/accumulation layers. The threshold voltage depends on the defect and/or impurity (if any) density in the intrinsic semiconductor layer, the dielectric material composition and thickness, workfunction difference between the TCO/metal and the intrinsic semiconductor, and the dielectric-related charges, which are well-known concepts for field-effect transistors. Those of skill in the art will appreciate that the principles of the invention also apply to tandem/multi-junction solar cells with top and/or bottom field-effect contact regions.

Solar cells are typically connected in series in a module to increase the output voltage. The cells can be integrated in such a way that output voltage of the module (the sum of the output voltages of the individual solar cells) is applied to the gates of the individual field-effect contact regions. This may improve the efficiency of the individual cells by raising the over-drive voltage of the field-effect contact regions and therefore the charge carrier density in the inversion/accumulation layers. Exemplary monolithic integration schemes are shown in FIGS. 4A and 4B for the solar cell structure 60 shown in FIG. 3A. Referring to FIG. 4A, a monolithic structure 130 comprises two solar cell structures 60 mounted between a common substrate 132 (e.g. glass) and an encapsulation layer 134. One of the top TCO layers 66' is operatively associated with adjoining solar cell structures 60. Specifically, the TCO layer 66' directly engages the top dielectric layer 64 of each solar cell structure 60. It is directly connected to the n+ contact region 70 on the opposite side of the intrinsic semiconductor layer of one solar cell structure 60, a p+ contact region 68 of the adjoining solar cell structure 60, and the TCO layer 66 on the opposite side of the adjoining solar cell structure.

FIG. 4B shows an alternative exemplary embodiment of a monolithic structure 140 employing a pair of solar cell structures 60. The solar cell structures are mounted to a substrate 142. An encapsulation layer 144 is provided above the structures. A dielectric layer 146 is provided above the TCO layers 66 of the adjoining cells. An electrically conductive layer, preferably a TCO layer 148, is provided between the dielectric layer 146 and the encapsulation layer 144. This TCO layer 148 is electrically connected to two of the TCO layers 66 of the adjoining solar cell structures 60. It will be appreciated that the solar cell structures described above with respect to FIGS. 1B-1F could also be incorporated as monolithic structures comprising two or more solar cell structures. It will further be appreciated that field-effect solar cells as described above with respect to FIGS. 1A-1F can be connected externally in series as opposed to monolithically as shown and described herein.

FIGS. 5A-K show exemplary embodiments of field-effect solar cell structures such as described above with respect to FIGS. 3A-F. For purposes of clarity, electrical connections between electrodes and contact regions, such as shown in FIGS. 3A-F, are omitted. Referring to the embodiment of FIG. 5A, the disclosed solar cell structure 150 has an absorption layer 152 of intrinsic amorphous hydrogenated silicon. A dielectric layer 154 of $SiO_x$ or $SiN_x$ is in direct contact with the top surface of the absorption layer. Two contact regions 156 are in direct contact with the absorption layer 152 and the dielectric layer 154. These contact regions 156 are p+ amorphous hydrogenated silicon or amorphous hydrogenated silicon carbon (a-SiC:H) in the exemplary embodiment. A third contact region 156' of n+ amorphous hydrogenated silicon (n+ a-Si:H) is in direct contact with the opposite side of the absorption layer 152. The electrodes 158 are made of a highly conductive material such as metal or a transparent conductive oxide (TCO). Transparent conductive oxides such as indium-tin-oxide (ITO) or aluminum doped zinc oxide are among those that could be employed. At least one of the electrodes should be transparent.

Figure 5A:
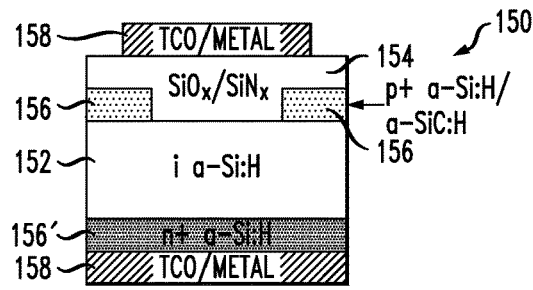
FIGS. 5A-5K show particular exemplary field-effect solar cell structures according to the invention employing field-effect contact regions.
Figure 5B:
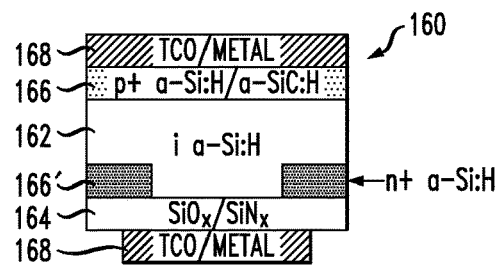

FIG. 5B shows a solar cell structure 160 wherein the absorption layer 162, dielectric layer 164, contact regions 166, 166' and electrodes 168 are comprised of the same materials as those comprising the corresponding layers in the solar cell structure of FIG. 5A. In this exemplary embodiment, the dielectric layer 164 adjoins the bottom surface of the absorption layer rather than the top surface thereof and n+ amorphous hydrogenated silicon contact regions 166' are located between and in direct contact with the absorption layer 162 and the dielectric layer 164. A p+ a-Si:H or a-SiC:H contact region 166 is in direct contact with the top surface of the absorption layer 162.

Figure 5C:
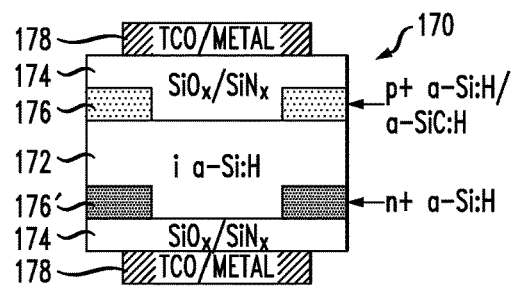

FIG. 5C shows a solar cell structure 170 wherein the absorption layer dielectric layers 174, contact regions 176, 176' and electrodes 178 are comprised of the same materials as those comprising the corresponding layers in the solar cell structure of FIGS. 5A and 5B. This exemplary embodiment, however, includes two dielectric layers 174, one adjoining each surface of the absorption layer 172. Two pairs of contact regions are respectively in direct contact with the absorption layer 172 and the dielectric layers 174. It will be appreciated that this embodiment may be configured in the same manner as that shown in FIG. 3B to provide two field-effect contact regions. As in FIG. 3B, the contact regions 176, 176' may be formed by deposition as opposed to doping.

Figure 5D:
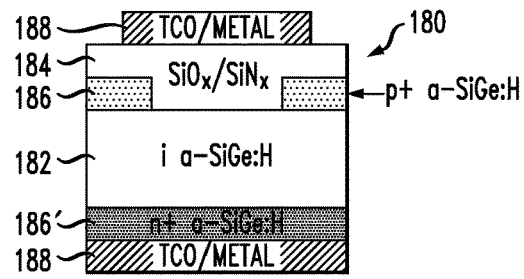

FIG. 5D shows a solar cell structure 180 wherein the absorption layer 182 is intrinsic amorphous hydrogenated silicon germanium. The one dielectric layer 184 is in direct contact with the top surface of the absorption layer 182. The top electrode 188 of this field-effect solar cell structure 180 will accordingly function as the "gate" electrode. Two p+ amorphous hydrogenated silicon germanium contact regions are in direct contact with the absorption layer and dielectric layer. An n+ amorphous hydrogenated silicon germanium layer 186 is in direct contact with the bottom surface of the absorption layer 182.

Figure 5E:
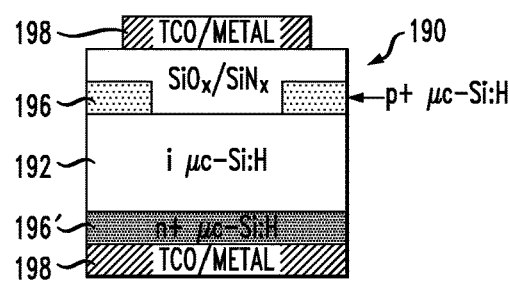

FIG. 5E shows a solar cell structure 190 similar to the solar cell structure 180 described above with respect to FIG. 5D. The intrinsic absorption layer 192 and the contact regions 196, 196' are, however, made of microcrystalline hydrogenated silicon. The dielectric layer 194 and electrodes 198 are the same as those found in the embodiments of FIGS. 5A-5D.

Figure 5F:
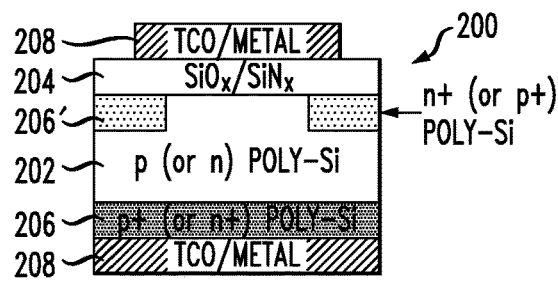

FIG. 5F shows a solar cell structure 200 having a p or n poly-Si absorption layer 202, a single dielectric layer 204 in direct contact with the absorption layer, n+ (or p+) contact regions 206' in direct contact with the absorption and dielectric layers, and a p+ (or n+) contact region 206 in contact with the opposite side of the absorption layer. The contact regions are poly-Si in this exemplary embodiment. The electrodes 208 are metal or TCO.

Figure 5G:
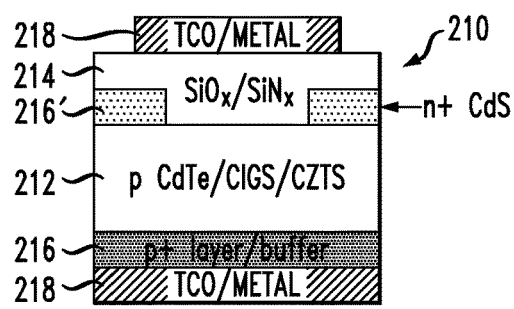

FIG. 5G shows a solar cell structure 210 having an absorption layer 212 of p CdTe, CIGS, CZTS or CZTSe, a single dielectric layer 214, n+ CdS contact regions 216' in direct contact with the absorption and dielectric layers, and a p+ contact region 216 directly contacting the opposite side of the absorption layer. The p+ layer may be formed with p+ $Sb_2Te_3$ or HgTe. The structure 210 includes metal or TCO electrodes 218.

Figure 5H:
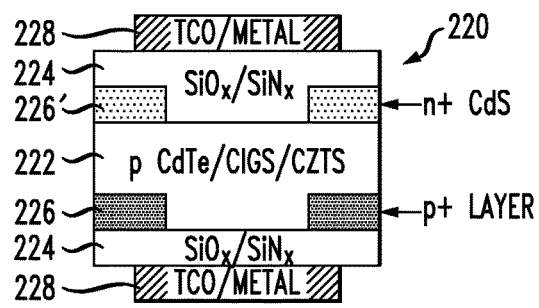

FIG. 5H shows a solar cell structure 220 having an absorption layer 222 of p CdTe/CIGS/CZTS/CZTSe, two dielectric layers 224, n+ CdS contact regions 226' in direct contact with the absorption layer and one of the dielectric layers, and p+ contact regions 226 between and directly contacting the opposite side of the absorption layer and the other of the dielectric layers. This exemplary embodiment includes metal or TCO electrodes 228 and is configured to include two field-effect contact regions.

Figure 5I:
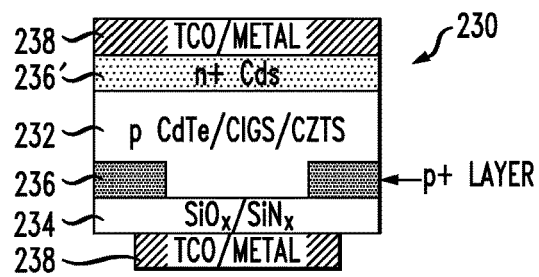

FIG. 5I shows a solar cell structure 230 having an absorption layer 232 of p CdTe/CIGS/CZTS/CZTSe, one dielectric layer 234, an n+ CdS contact region 236' in direct contact with the absorption layer, two p+ contact regions 236 between and in direct contact with the absorption layer 232 and the dielectric layer 234, and electrodes 238.

Figure 5J:
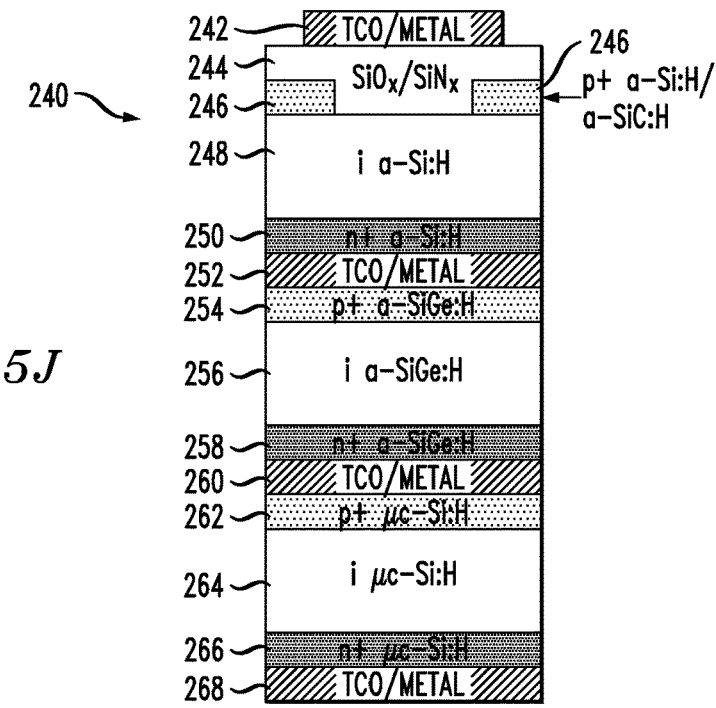

FIG. 5J shows a tandem junction solar cell structure 240 having a field-effect p+ contact region, a conventional a-SiGe:H middle cell, and a microcrystalline hydrogenated silicon bottom cell. The solar cell structure 240 comprises, from top to bottom, an electrode 242 that may be metal or a TCO, a dielectric layer ($SiO_x$ or $SiN_x$) 244, contact regions 246 of p+ a-Si:H or a-SiC:H, an intrinsic amorphous hydrogenated silicon absorption layer 248 in direct contact with the contact regions 246 and dielectric layer 244, a contact region 250 of n+ a-Si:H, a second electrode 252, a p+ a-SiGe:H layer 254, an intrinsic amorphous hydrogenated silicon germanium absorption layer 256, an n+ a-SiGe:H contact region 258 in direct contact with the intrinsic amorphous hydrogenated silicon germanium layer 256, a third electrode 260, a p+ microcrystalline hydrogenated silicon layer 262, an intrinsic, microcrystalline hydrogenated silicon absorption layer 264, an n+ microcrystalline hydrogenated silicon layer 266, and a fourth electrode 268. The first electrode functions as the "gate" electrode in this exemplary embodiment.

Figure 5K:
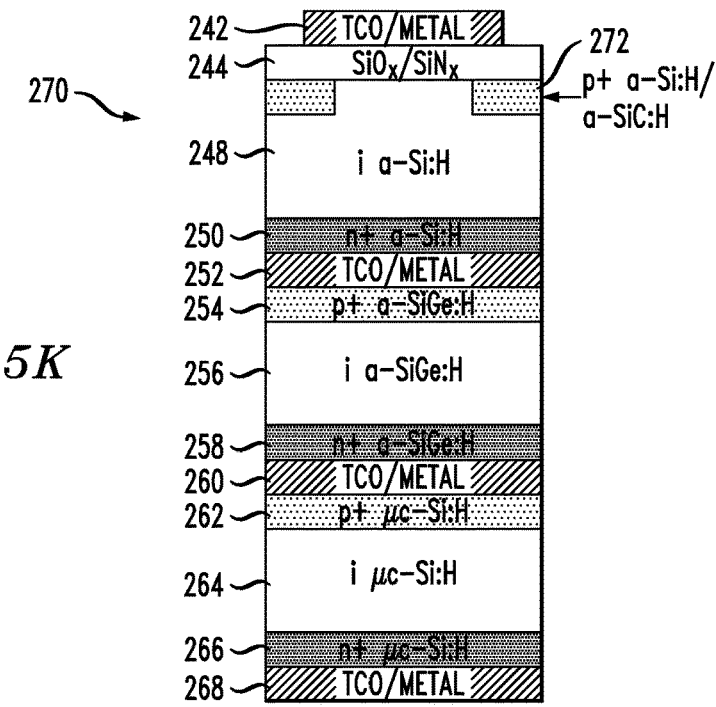

FIG. 5K shows a solar cell structure 270 similar to that shown in FIG. 5J. The same reference numerals are accordingly employed to designate similar elements. In contrast to cell structure 240 which is grown from bottom to top, cell structure 270 is grown from top to bottom. The substrate used for growth (typically glass) is present on top of layer 242 (not shown in the figure).

FIGS. 6A-6D show exemplary embodiments "double-gate" solar cell structures in accordance with the invention. FIG. 6A, for example, is a generic representation of the solar cell structure 170 described more specifically above with reference to FIG. 5C. The solar cell structure 280 includes an absorption layer 282, two dielectric layers 284, contact regions 286, 286', and electrodes 288. As discussed above, the contact regions are in direct contact with opposite side of the absorption layer 282 and the adjoining dielectric layer 284. The contact regions 286 on one side of the absorption layer are either capable of injecting holes or electrons into the absorption layer. The contact regions 286' on the opposite side of the absorption layer function in an opposite manner. In other words, if the contact regions 286 on one side of the absorption layer inject holes, those on the opposite side inject electrons into the absorption layer. If the contact region(s) on the top of the absorption layer is n-type or a Schottky contact (metal or silicide) with a low work-function compared to that of the absorption layer, the contact region(s) on the bottom of the absorption layer would be p-type or a Schottky contact (metal or silicide) with a high work-function compared to that of the absorption layer. A highly doped n-type region or a Schottky contact with low work-function is capable of injecting electrons into the absorption layer. A highly-doped p-type region or a Schottky contact with a high work-function is capable of injecting holes into the absorption layer.

In the exemplary embodiments of FIGS. 6A-6D, the absorption layer is comprised of an intrinsic semiconductor (undoped) or a lightly doped semiconductor (n-type or p-type). At least one side of the absorption layer is comprised of a dielectric layer in direct contact with the absorption layer and at least one highly-doped contact region or Schottky contact region in direct contact with both the dielectric layer and the absorption layer. In the embodiments of FIGS. 6A-6D, both sides of the absorption layer include dielectric layers and contact regions. The dielectric layer(s) is disposed between an electrode and the absorption layer.

Typically, there is some overlap between the electrode and contact regions as shown in FIGS. 6A-6D, but there may in fact be no overlap or a greater overlap than is shown. The electrodes 288 are highly electrically conductive and can made of metal, a highly doped polycrystalline semiconductor, or a transparent conductive material such as transparent conductive oxide (TCO). At least one of the top or bottom electrodes is transparent to allow light to enter the absorption layer 282.

The exemplary solar cell structures 290, 300, and 310 shown in FIGS. 6B-6D, respectively, are similar to that shown in FIG. 6A and the same reference numerals are used to designate similar elements. In some embodiments, structures as shown in FIGS. 6A-6D, 7A-7B, and 8A-8H may be formed from top to bottom or from bottom to top on a starting substrate such as glass, plastic or metal foil. In these embodiments, the starting substrate is present either on top of electrode 1 or bottom of electrode 2 (not shown in the figures). In other embodiments, the absorption layer (282 in FIGS. 6A-6D, 322 in FIGS. 7A-7B and 8A-8H) may be the starting substrate, such as crystalline or multicrystalline Si, Ge or GaAs wafers. In these embodiments, the contact regions are either grown/deposited onto, or doped into the absorption layer. The dielectric layers are posited/grown onto the starting substrate or formed by chemical reactions consuming part of the starting substrate. An example of the latter is the thermal oxidation of Si to form $SiO_2$. Note that the top and bottom sides of the absorption layer may be processed separately or simultaneously. The schematic drawing of contact regions 286 and 286' inside the absorption layer 282 in FIGS. 6A-6D indicates that either the absorption layer is deposited/grown onto the contact regions, or the contact regions are doped into the absorption layer. In contrast, the schematic drawing of the contact regions outside the absorption layer indicates that the contact regions are deposited/grown onto the absorption layer. (The absorption layer 322 may likewise be deposited/grown onto the contact regions 326, 326', the contact regions can be doped into the absorption layer 322, or the contact regions can be deposited/grown onto the absorption layer 322 in the embodiments of FIGS. 7A-7B and 8A-8H.) The absorption layer 282, 322 may be comprised of any known semiconductor material of any known crystalline structure such as amorphous, nanocrystalline, microcrystalline, polycrystalline, multicrystalline or single (mono) crystalline. Examples include but are not limited to elemental semiconductors of group IV and combinations thereof, e.g. Si, Ge, SiGe, SiC; various compound semiconductors comprised of at least one element of group iii and one element of group IV, e.g. GaAs, InP, AlAs, InAs, InSb, GaN, GaP, InN, InGaP, InGaAs, AlGaAs, InGaN, InAlAs, InGaAsP; organic materials including small molecules and polymers, e.g. poly(3-hexyl-thiophene) ($P_3HT$), phenyl-C61-butyric acid methyl ester (PCBM), cyano-polyphenylene vinylene (CN-PPV), poly-phenylene vinylene (PPV), phthalocyanine, polyacetylene; metal-oxide semiconductors comprising at least one metallic element and oxygen, e.g. ZnO, $SnO_2$, $In_2O_3$, $Ga_2O_3$ and combinations thereof; and special forms of C such as graphene and carbon nanotubes.

FIGS. 7A and 7B are generic illustrations of solar cell structures 320, 330 according to the invention that correspond to the specific structures 180, 200 shown in FIGS. 5D and 5F, respectively. In these embodiments, a highly-doped contact region or Schottky contact region 326' is in direct contact with the bottom of the absorption layer 322 and an electrode 328 is in direct contact with the aforementioned region 326'. A dielectric layer 324, contact regions 326 and a second electrode 328 are on the opposite side of the absorption layer.

FIGS. 8A and 8B are generic illustrations of solar cell structures 340, 350 according to the invention that include a highly-doped contact region or Schottky contact region 326' in direct contact with the top of an absorption layer 322 and an electrode 328 in direct contact with the aforementioned region 326'. A dielectric layer 324, contact regions 326 and a second electrode 328 are on the opposite side of the absorption layer.

Figure 8C:
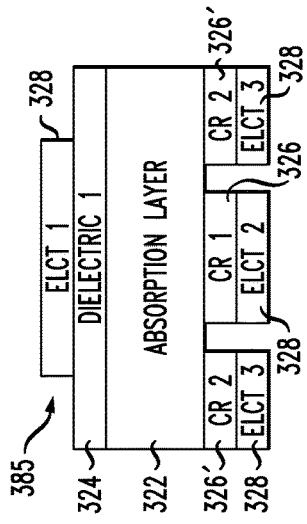
Figure 8D:
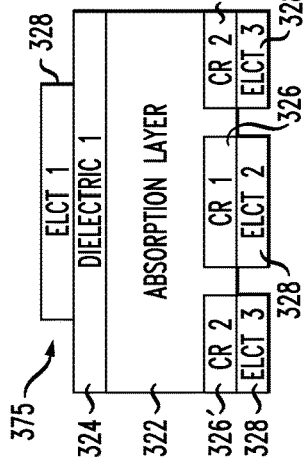
Figure 8E:
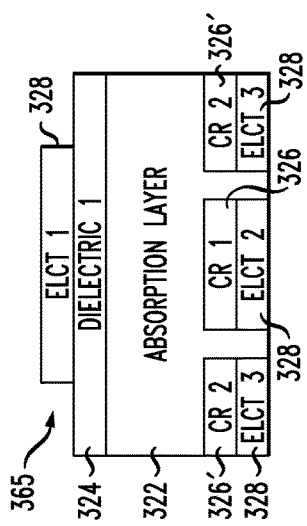
Figure 8F:
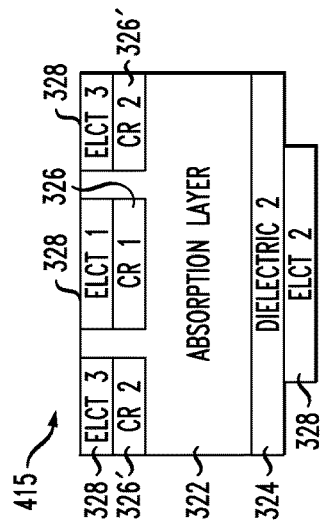
Figure 8G:
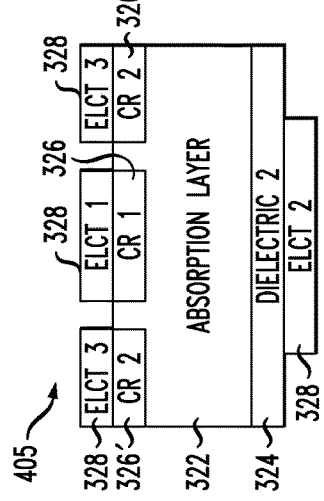
Figure 8H:
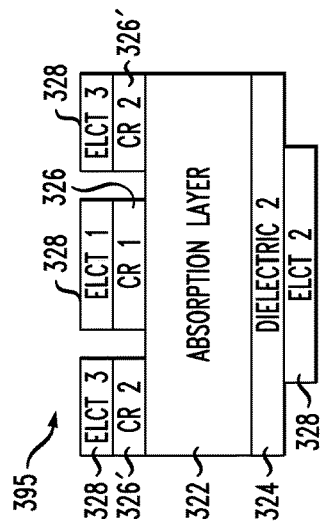

FIGS. 8C-8H illustrate further solar cell structures wherein the contact regions 326, 326' and corresponding electrodes 328 are formed in various manners. In FIG. 8C, for example, the contact regions 326, 326' and corresponding electrodes 328 are shown as within the absorption layer 322. This type of structure can be obtained by growing the structure 365 from bottom to top. FIG. 8D schematically illustrates a structure 375 similar to that shown in FIG. 8C except the electrodes 328 adjoining the contact regions are deposited on the absorption layer 322 and are therefore not within it. In the structure 385 shown in FIG. 3E, the contact regions 326, 326' and adjoining electrodes 328 are deposited on the absorption layer 322. FIGS. 8F-8H illustrate further structures 395, 405 and 415, respectively, wherein the contact regions and adjoining electrodes are formed at the top of the absorption layer 322 rather than the bottom.

In all of the embodiments shown in FIGS. 6-8, at least one electrode on one dielectric-containing side of a solar cell structure is electrically connected directly or through a power supply to at least one of the contact regions on the opposite side of the absorption layer of the same solar cell structure or another solar cell structure in a circuit or module. If connected through a power supply, one terminal of the power supply (not shown) is connected to the aforementioned electrode and the other terminal is connected to the contact region. In other words, the power supply would be connected in series between the electrode and the contact region. The power supply may be, for example, a battery or any kind of solar cell.

Figure 9A:
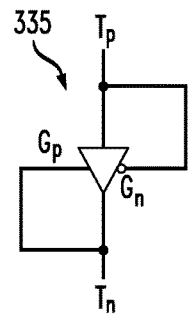
FIGS. 9A-9H show exemplary circuit elements for single and double-gated field-effect solar cell devices in accordance with the invention.
Figure 9B:
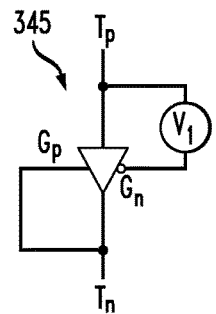
Figure 9C:
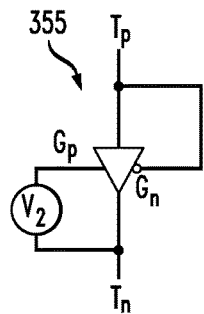
Figure 9D:
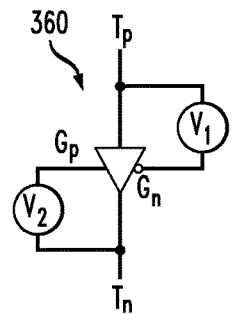
Figure 9E:
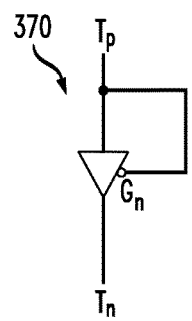
Figure 9F:
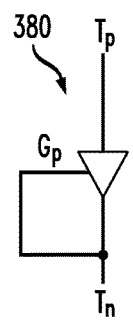

FIGS. 9A-H provide exemplary circuit diagrams for solar cell structures such as those described above. FIGS. 9A, 9E and 9F show self-powering devices that do not rely on a power supply connected in series between an electrode and contact region. FIGS. 9A-D snow "double gate" structures that would include two dielectric layers, one on each side of an absorption layer. FIGS. 9E-H show "single gate" structures that would include only one dielectric layer adjoining an absorption layer. $T_p$ represents a terminal connected to the p-type or high work-function contact region of a solar cell structure. $T_n$ designates a terminal connected to the n-type or the low work-function contact region. $G_p$ is a terminal connected to the gate electrode associated with the p-channel embedded transistor device, i.e. the gate electrode that induces holes in the absorption layer. Similarly, $G_n$ is a terminal connected to the gate electrode associated with the n-channel embedded transistor device, i.e. the gate electrode that induces electrons in the absorption layer. $V_1$ and $V_2$ represent the power supplies, if used, connected in series between certain electrodes and contact regions. FIG. 9A, for example, shows a self-powering, double gated device 335. FIGS. 9B and 9C show double gated devices 345, 355 having one power supply. FIG. 9D shows a double gated device 360 including two power supplies. As discussed above, the power supply, if employed, is part of the connection between an electrode on one dielectric-containing side of a device and a contact region on the other side of the device. Self-powering devices or circuits are preferred.

Figure 9G:
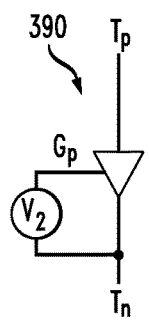
Figure 9H:
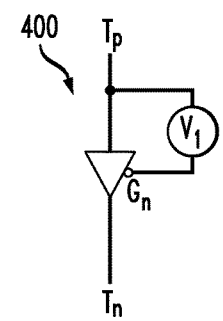

FIGS. 9E and 9F shows self-powering structures 370, 380 having gate connections $G_n$ and $G_p$, respectively. FIG. 9G shows a structure 390 similar to that shown in FIG. 9F, but includes a power supply $V_2$. FIG. 9H shows a structure 400 similar to that shown in FIG. 9E as employed with a power supply $V_1$.

Figure 10A:
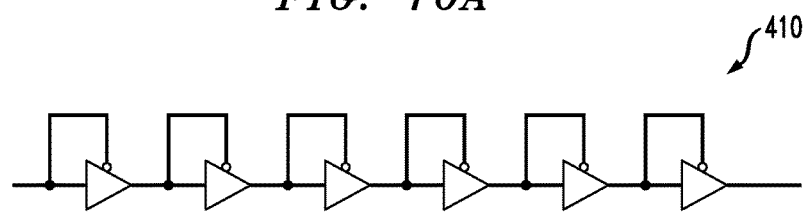
FIGS. 10A-10C show series connected solar cell devices in which at least one gate terminal of a solar cell device as shown in FIG. 9E is connected to a non-gate terminal on the opposite side of the same device or another device in the circuit.
Figure 10B:
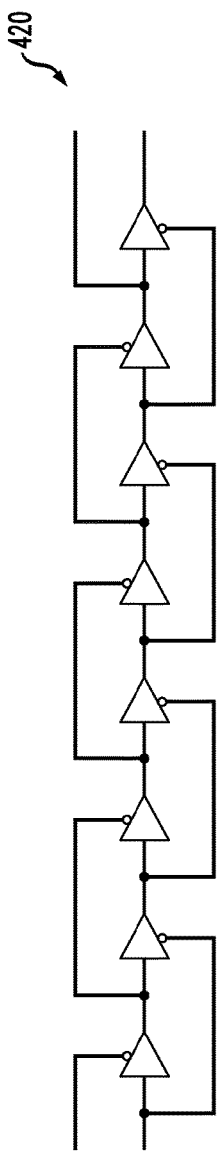
Figure 10C:
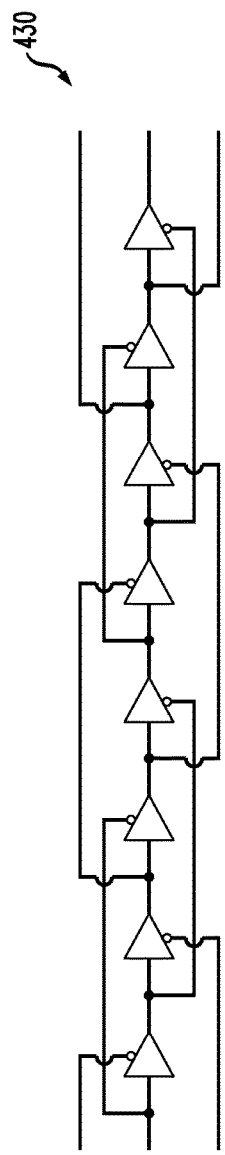

Solar cell structures are commonly integrated in series to increase the output voltage of a module. As shown in FIGS. 10A-10C, structures as disclosed herein can be integrated by connecting at least one gate terminal to a non-gate terminal on the opposite side of the same structure or another structure in the module. The examples of FIGS. 10A-10C, show the integration of a plurality of single-gated structures, each corresponding to the structure 370 illustrated in FIG. 9E.

Referring to FIG. 10A, an integrated structure 410 of self-powered, single-gate devices 370 is shown. If the devices are connected as shown, a first-order approximate criterion for device operation is that the open circuit voltage of the embedded solar cell device ($V_{oc}$>0) is greater than the threshold voltage of the embedded transistor device, i.e. $V_{oc}$>$V_{Tn}$ (in case of an n-channel transistor device, i.e. electron conduction in channel). $V_{oc}$>$-V_{Tp}$ in the case of a p-channel transistor device, i.e. hole conduction in channel). $V_{Tn}$ and $V_{Tp}$ denote the threshold voltage of n-channel and p-channel transistor devices, respectively.

In the cases of the structures 420, 430 of FIGS. 10B and 10C, the criteria are relaxed with respect to the structure 410 of FIG. 10A to $V_{oc}$>$V_{Tn}/2$ ($V_{oc}$>$-V_{Tp}/2$) and $V_{oc}$>$V_{Tn}/3$ ($V_{oc}$>$-V_{Tp}/3$), respectively, assuming devices with the same characteristics.

For self-powered, double-gate devices such as shown in FIG. 9A, $V_{Tn}$ or $-V_{Tp}$ are replaced by $V_{Tn}-V_{Tp}$ in the above equations. Specifically, $V_{oc}$>$V_{Tn}-V_{Tp}$, $V_{oc}$>($V_{Tn}-V_{Tp}$)/2 and $V_{oc}$>($V_{Tn}-V_{Tp}$)/3 respectively. ($V_{Tn}$ is the threshold voltage on the n-side or low work-function side and $V_{Tp}$ is the threshold voltage on the p-side or high work-function side of a device.) The structures shown in FIGS. 10A-10C are intended to be exemplary rather than limiting. Any connection of the devices falling within the above description (i.e. connecting at least one gate terminal to a non-gate terminal on the opposite side of the same device or another device) are within the scope of the invention. In addition, it should be understood that the devices present in the circuit do not necessarily have to be the same and may indeed have different characteristics. Some of the devices in a given circuit may be conventional solar cells while others are solar cells constructed in accordance with the teachings of the invention.

Figure 11:
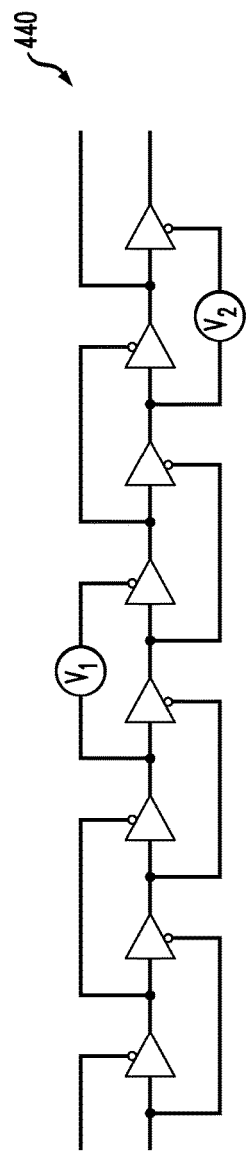
FIG. 11 shows series connected solar cell devices as shown in FIG. 10B further including power supplies in the circuit.

It should be noted that one or more connections in a circuit can be made through one or more power supplies. FIG. 11 shows an exemplary circuit 440 including two power supplies.

Series connection of solar cells as discussed with respect to FIGS. 10B and 10C provides an increase in module output voltage. It also addresses the fact that the $V_{oc}$>$V_T$ criterion may not always be possible to meet. $V_{oc}$ has an upper limit of energy bandgap. $V_T$ depends on various parameters (e.g. gate/channel work-function, fixed/interface charge, channel doping/defect density, gate dielectric capacitance) which may not be arbitrarily changed and which may affect device performance yield and reliability. With respect to amorphous hydrogenated silicon absorption layers in particular, a typical $V_{oc}$ is about IV and a typical $V_T$ is about 2V with a standard TFT gate dielectric (a-SiN$_x$:H) thickness of about three hundred nanometers (300 nm). Accordingly, the criterion of $V_{oc}$>$V_T$ is not met. A thickness of less than three hundred nanometers for the a-SiN$_x$:H layer could be employed to reduce $V_T$, but this reduces yield and reliability in production. Deposition of a-SiN$_x$:H at high rates during production to increase throughput may result in a high density of defects and therefore a high gate leakage current and prone to dielectric breakdown failure when thin. Other TFT technologies (e.g. organic, metal oxide) not in widespread production to date are expected to suffer from similar yield/reliability issues at high throughput.

Example 1: Hydrogenated Amorphous Silicon (a-Si:H) Device

Figure 2:
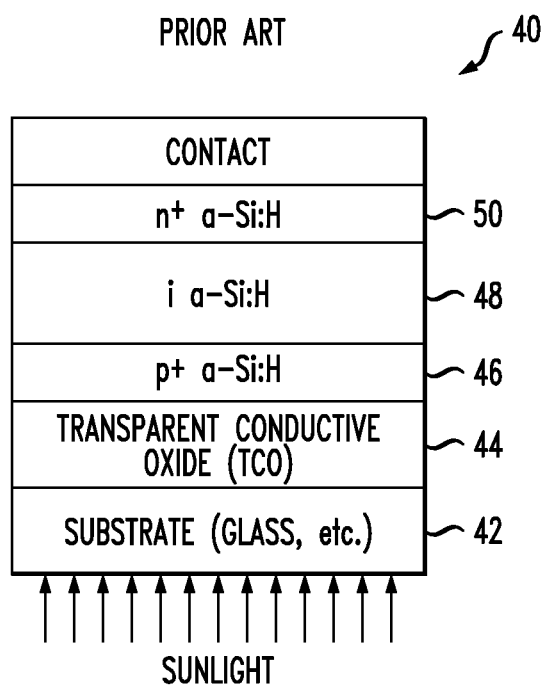
FIG. 2 shows an exemplary prior art amorphous silicon p-i-n solar cell.

As discussed above, amorphous hydrogenated thin-film transistors as shown in FIG. 1 and amorphous hydrogenated silicon p-i-n solar cells as shown in FIG. 2 are in widespread production. In accordance with the invention, a field-effect photovoltaic device is provided that includes operative features of both devices. FIGS. 12A and 12B show exemplary devices employing aspects of the invention.

The n-i-p solar cell device 450 shown in FIG. 12A includes a transparent substrate 452 (e.g. glass), a TCO gate contact 454, an a-SiNx:H dielectric layer 456, an intrinsic amorphous hydrogenated silicon layer 458, a p+ amorphous hydrogenated silicon contact region 460, and n+ amorphous hydrogenated silicon contact regions 462. The p-i-n solar cell device 470 shown in FIG. 12B includes similar elements that are designated with the same reference numerals as used in FIG. 12A, except the middle contact region 462 is n+ rather than p+ and the two other contact regions 460 are p+. In both embodiments, metal contacts 461 are in direct contact with the contact regions.

A typical method for the deposition of intrinsic and doped a-Si:H and a-SiN$_x$:H is plasma-enhanced chemical vapor deposition (PECVD) although other techniques may be used as well. The transparent conductive material is typically a transparent conductive oxide (TCO) such as indium-tin-oxide (ITO) or aluminum-doped zinc-oxide (ZnO:Al) or AZO), which are typically deposited by sputtering or CVD techniques.

Light may enter photovoltaic devices such as those disclosed herein from the top, bottom or both sides (the latter is typically called a bifacial cell). At least one of the top contacts (the top middle contact in the devices shown in FIGS. 12A and 12B) of the p-i-n or structure formed within the device or the bottom (gate) contact 454 must be transparent to allow light to enter the i a-Si:H layer 458. Advantages of a field-effect electron (or hole) accumulation layer compared to an n$^+$ doped (or p$^+$ doped) a-Si:H layer include (i) higher density of free electrons (or holes) and therefore a lower [in case of electrons] (or higher [in case of holes]) work-function resulting in a solar cell device with a higher open circuit voltage, (ii) higher density of free electrons (or holes) and therefore a lower resistivity [i.e. higher conductivity] resulting in a solar cell device with a higher fill-factor, and (iii) lower light absorption and therefore smaller absorption loss before the light enters the i a-Si:H absorption layer, resulting in a solar cell device with a higher short circuit current. (Due to the very short scattering length of carriers in n+ and p+ a-Si:H, the majority of light absorbed in the n$^+$ or p$^+$ a-Si:H layers is lost in the form of neat rather titan being converted to electricity.) These advantages apply to other thin-film technologies that may be employed in accordance with the invention, including nano-, micro-, polycrystalline Si, Ge or SiGe, organic materials, and metal oxides.

Figure 13C:
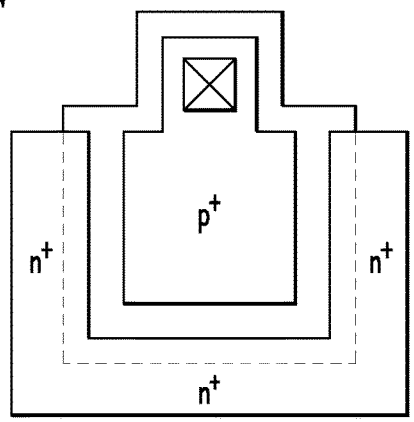

The disclosed devices 450, 470 also offer the advantage of integrating transistors and solar cells using a single fabrication technology. For example, referring to the device 450 shown in FIG. 12A, if the top right and left contact regions 462 (labeled as source/drain) are used independently (i.e. two independent external contacts are connected to them), and the top middle contact region 460 is unused (i.e. with no external connections), and the gate via is omitted (so that the top middle contact region 460 is not connected to the bottom gate 454) the device will operate as a conventional a-Si:H TFT shown in FIG. 1. If the top right contact regions 462 are connected to each other either externally (for example using a metal interconnect on the chip, or metal wires, etc.) or internally by changing the layout (e.g. see FIG. 13C), or if only one of them exists or only one of them is used (i.e. the other one just left unused, i.e. with no external connection), and the top contact region 460 is connected to the bottom gate electrode 454, e.g. through the gate via, then the device is a field-effect solar cell device as disclosed. Therefore, whether the device is a solar cell or a transistor is simply a matter of wiring/interconnecting or slightly changing the individual device layout, rather than requiring two separate fabrication technologies for the solar cells vs. transistors. Although disclosed herein with respect to a-Si:H technology, it is true for all devices within the scope of this disclosure, regardless of the technology or materials being used.

During operation of the device 450 shown in FIG. 12A, light causes holes generated in the i a-Si:H layer to be drifted to the p+ a-Si:H contact region 460 which has a low electric potential for holes (i.e. high electric potential for electrons), and electrons generated in the i a-Si:H layer are drifted to the i a-Si:H/a-SiNx:H interface region (in i a-Si:H) where the electric potential for electrons is lowered by the electric field induced by the gate contact 454 (which is connected to the top p+ a-Si:H region) through the gate dielectric layer 456 (which is a-SiNx:H). There may or may not be an initial accumulation of electrons in i a-Si:H at the i a-Si:H/a-SiNx:H interface depending on the threshold voltage of the gate/a-SiNx:H/i a-Si:H thin-film-transistor (TFT) stack. (For standard a-Si:H TFT stacks, there is usually an initial accumulation of electrons due to the presence of fixed positive charge in a-SiNx:H; however, the density of accumulated electrons is below the density at the onset of strong accumulation, i.e. the density required for the formation of an electron channel, referred to as the turn-on of the transistor.) Due to the collection of photo-generated holes at the p+ a-Si:H contact and the collection of photo-generated electrons at the i a-Si:H/a-SiNx:H interface region, a photo-generated (i.e. light-induced) voltage is built up across the p+ a-Si:H contact region and at the i a-Si:H/a-SiNx:H interface region (i.e. the channel region). As the electric potential of the channel region (for electrons) drops, the potential barrier for electrons between the n+ a-Si:H contact region(s) 462 and the channel region drops, increasing the rate of electron transfer from the n+ a-Si:H region(s) to the channel. If the photo-generated voltage built-up across the p+ a-Si:H contact and the channel is higher than the voltage required for strong accumulation of electrons in the channel (i.e. the threshold voltage of the transistor device), the n+ a-Si:H contact region(s) 462 and the channel become nearly equi-potential (i.e. having the same electric potential and voltage), and the output voltage of the solar cell device (measured between the n+ and p+ contact regions which are used as the output terminals of the disclosed solar cell device) becomes nearly equal to the photogenerated voltage across the p+ contact and the channel. Strong accumulation is also necessary to ensure sufficient conductivity of the channel and therefore sufficiently low internal resistance of the solar cell to achieve high conversion efficiency. When a solar cell device is not connected to an external load, the output voltage of the solar cell is typically referred to as the open-circuit voltage of the solar cell. Therefore a basic criterion for the operation of the disclosed solar cell device is that the photo-generated open circuit voltage of the device is higher that the threshold voltage of the thin-film-transistor stack. The open circuit voltage of a solar cell cannot exceed the theoretical upper limit of the optical bandgap energy of the absorption layer (the material absorbing light which is a-Si:H in this exemplary embodiment) divided by the electric charge of an electron (the practical open circuit voltages are smaller than this theoretical upper limit). In practice, when a load is connected to the solar cell, (which is the case when the solar cell is in operation as a power supply), the output voltage of a solar cell drops due to the internal electrical resistance of the solar cell. Therefore, the open circuit voltage must be sufficiently higher than the threshold voltage to allow the solar cell operation taking this voltage drop into account. The threshold voltage of a transistor depends on many parameters including the thickness and dielectric constant of the gate dielectric, semiconductor channel material (material type and quality, defect density, and doping if present), work-function of the gate contact material, fixed charge and defect density in the gate dielectric, and gate dielectric/channel semiconductor interface charge; and may be adjusted to some extent depending on the transistor technology. In addition, circuit schemes such as shown in FIGS. 10B and 10C can be used to reduce the voltage value the open circuit voltage needs to exceed, for example to half or one-third of the threshold voltage. This is because two or three times as high a photo-generated voltage is dropped, across the n+ a-Si:H contact region(s) and the gate of an individual device as compared to that of connecting the p+ contact region of an individual device to the gate of the same device. The operation of the p-i-n solar cell device 470 shown in FIG. 12B is substantially the same with the opposite type of carrier/doping involved. FIGS. 13A and 13B show exemplary layouts for the devices shown in FIGS. 12A and 12B, respectively.

Devices as disclosed above with reference to FIGS. 12A and 12B provide a number of advantages. As both the p+ and n+ contact regions are on the back side of the device, absorption losses can be reduced and a higher short circuit current can be expected. The devices provide an accumulated channel equivalent to a highly doped material, but without defect creation (due to defect-dopant coupling), negligible band-gap narrowing, and negligible Auger recombination. Higher open circuit voltage and higher fill-factor (FF) is accordingly expected. As discussed above, the principles of the invention are applicable to any thin film technology, not just amorphous hydrogenated silicon. In the case of amorphous hydrogenated silicon, the present invention is compatible with TFT technology for TFT/LCD backplanes. In addition, the availability of TFTs and solar cells allows for integrated smart circuits.

Example 2: GaAs Device

Figure 14:
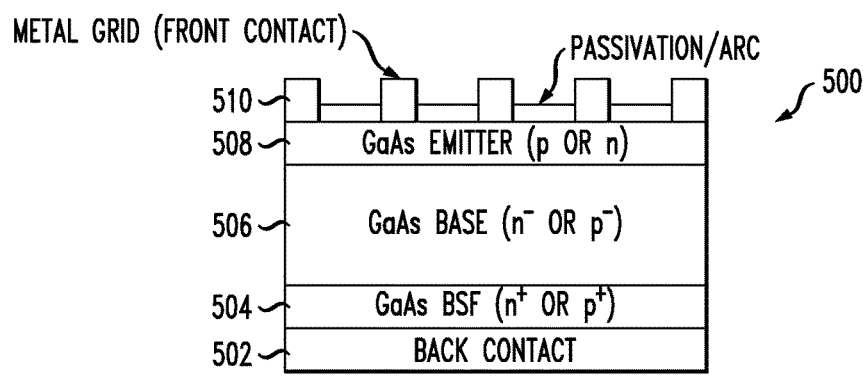
FIG. 14 shows a prior art single-junction GaAs solar cell device.

A schematic cross-sectional view of a typical single-junction GaAs solar cell 500 is shown in FIG. 14. This cell includes a back contact 502, a GaAs back surface field 504, a GaAs base layer 506, a GaAs emitter, a passivation layer 508, and a metal grid 510. Devices of this type have reached power conversion efficiencies of as high as 27% under 1 sun.

Figure 15:
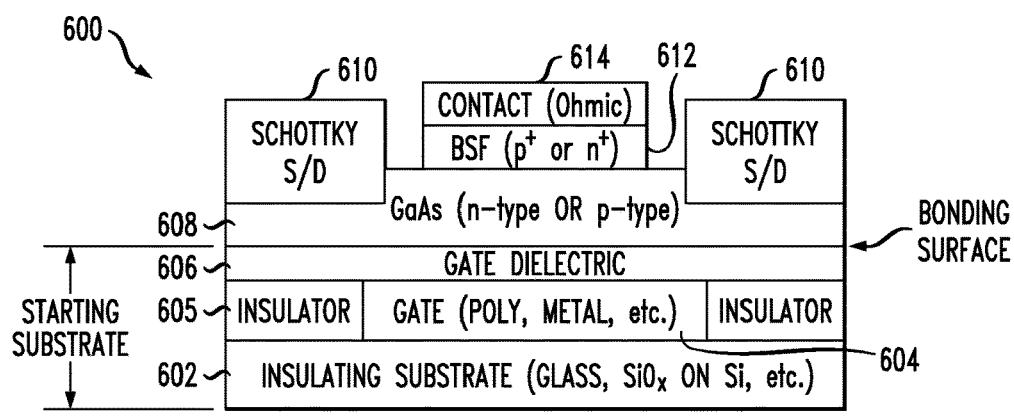
FIG. 15 shows an exemplary field-effect solar cell device in accordance with the invention that includes a III-V absorption layer.

However, the cost of materials and fabrication process of these solar cells is high. To reduce the materials cost, thin layers of GaAs need to be used, for example using layer transfer techniques (to transfer a thin layer of GaAs from a GaAs wafer or boule onto a handle substrate). Pub. No. US 2010/0311250 discloses a layer transfer technique wherein a tensile stressed metal layer is employed in conjuction with a flexible handle substrate to fracture a Ge or GaAs substrate to obtain a layer of suitable thickness for incorporation within a solar cell. This publication is incorporated by reference herein. The main cost associated with the fabrication process is the cost of epitaxial growth which is typically performed by metal-organic chemical vapor deposition (MOCVD). Epitaxial growth is required at least for growing the emitter junction which needs to be a high-quality shallow junction in order to achieve high conversion efficiency. The back-surface-field (BSF) junction may be grown also by epitaxy but alternative techniques such as diffusion may be used as well to form the junction. A field-effect GaAs solar cell device based on the present invention eliminates the need for epitaxial growth and can therefore reduce the fabrication cost for GaAs or other semiconductors, and is in addition to the advantage of integrating transistors and solar cells using a single technology, which applies to all technologies as mentioned earlier. An exemplary structure for a field-effect GaAs photovoltaic device 600 is shown schematically in FIG. 15.

The photovoltaic device 600 comprises an insulating substrate 602 such as glass or $SiO_x$ on silicon. A gate 604 is on the substrate and is in contact with a gate dielectric layer 606. A n-type or p-type gallium arsenide absorption layer 608 contacts the gate dielectric layer. A pair of Schottky source/drain regions 610 engage the absorption layer. A p+ or n+ BSF layer 612 also adjoins the absorption layer 608 and a metal contact 614 is formed, on the BSF layer 612.

An exemplary fabrication process follows below with the understanding that order of the fabrication process steps may be altered as known by those of ordinary skill in the art. A back-surface-field (BSF) region 612 is formed on a GaAs wafer or bottle (not shown), e.g. by diffusion. A metal contact layer may be deposited on top of the BSF region at this point, and may serve as a stressor layer for certain layer transfer techniques as discussed above with respect to Pub. No. 2010/0307572. A thin layer of GaAs (the BSF region, the metal contact layer on top of BSF and a thin layer of the GaAs wafer or boule) is then transferred onto a handle substrate using known layer-transfer techniques. Separately, a "starting substrate" is formed by depositing a gate layer 604, optional insulating layers 605 (for example for the purpose of planarizing) and a gate dielectric layer 606 on an insulating substrate 602. The transferred layer described above is then bonded to this "starting substrate" using known bonding techniques. The handle substrate is then removed from the top of the BSF region. The device structure is then completed by patterning the BSF region and the metal contact layer, and forming the Schottky source/drain regions 610 (typically metal or silicide).

The operation of the GaAs device is the same as that of an a-Si:H device other than that the transistor channel is formed typically by inversion rather than accumulation (which is the case in most crystalline channel materials in contrast to amorphous or organic materials), and the collection of photogenerated carriers is dominated by diffusion rather than drift (which is the case in p-n junctions typically suitable for crystalline materials in contrast to p-i-n junctions typically suitable for amorphous and organic materials due to the short carrier diffusion lengths in amorphous and organic materials).

Given the discussion thus far, it will be appreciated that, general terms, an exemplary photovoltaic structure, according to an aspect of the invention, includes an absorption layer having first and second sides. A dielectric layer is in direct contact with the first side of the absorption layer. A first contact region is in direct contact with the dielectric layer and the absorption layer. As discussed above, contact regions may be, for example, highly doped regions or Schottky contact regions. As further discussed above, doped contact regions can be formed either by deposition or by doping the absorption layer. A first electrode is in direct contact with the dielectric layer, the first electrode being highly electrically conductive. A second contact region is in direct contact with the second side of the absorption layer. One of the first and second contact regions, for example a n+ region, is low work-function with respect to the absorption layer. The other of the first and second contact regions, for example a p+ region, is high work-function with respect to the absorption layer. The first electrode is electrically connected to the second contact region. A second highly conductive electrode is on the second side of the absorption layer and in direct contact with the second contact region. FIGS. 3D, 3E, 7A, 7B, 8A and 8B show exemplary, single-gate, photovoltaic structures of this type while FIGS. 9E-9F show circuit elements corresponding to the exemplary single-gate photovoltaic structures. Solar cell structures employing such single-gate, field-effect photovoltaic structures are shown in FIGS. 5J and 5K.

In accordance with a further aspect of the invention, a photovoltaic structure is provided that includes an absorption layer having first and second sides, a first dielectric layer in direct contact with the first side of the absorption layer, and a second dielectric layer in direct contact with the second side of the absorption layer. A first contact region is in direct contact with the first dielectric layer and the absorption layer. A first electrode is in direct contact with the first dielectric layer, the first electrode being highly electrically conductive. A second contact region is in direct contact with the second dielectric layer and the absorption layer. One of the first and second contact regions is low work-function with respect to the absorption layer and the other of the first and second contact regions is high work-function with respect to the absorption layer. The first electrode is electrically connected to the second contact region. A second electrode is on the second side of the absorption layer and in direct contact with the second dielectric region, the second electrode being highly electrically conductive and electrically connected to the first contact region. FIGS. 3A, 3B and 3F show exemplary structures in accordance with this aspect of the invention. FIGS. 5C and 5H show two specific exemplary structures thereof.

A photovoltaic structure in accordance with a further aspect of the invention comprises an absorption layer, a dielectric layer in direct contact with the absorption layer, one or more high work-function contact regions in direct contact with the absorption layer, and one or more low work-function contact regions in direct contact with the absorption layer. The exemplary embodiment of FIG. 12A shows a photovoltaic structure including an intrinsic amorphous semiconductor layer 468 as the absorption layer, an a-SiN$_x$:H dielectric layer 456, a high work-function contact region 460, and low work-function contact regions 462. A gate electrode is in direct contact with the dielectric layer and electrically connected to one of the contact regions.

Referring again to FIG. 12A, a TCO gate electrode 454 is in direct contact with the dielectric layer 456. The gate electrode 454 in this embodiment is electrically connected to the p+ contact region 460 by a gate via as shown in FIG. 13A. A first terminal (metal contact 461) is connected to one of the one or more high work-function contact regions and a second terminal is connected to one of the one or more low work-function contact regions. A gate terminal connected to the gate electrode. In the embodiments of FIGS. 12A and 12B, the one or more low work-function contact regions and the one or more high work-function contact regions are located on a first side of the absorption layer and the dielectric layer is located on a second side of the absorption layer. The transparent substrate and gate allow light to penetrate the absorption layer 456.

A photovoltaic circuit is provided in accordance with a further aspect of the invention and may be particularly useful where the open circuit voltage of a particular solar cell device is not greater than the threshold voltage. The circuit comprises a plurality of solar cell devices, each device comprising an absorption layer, a dielectric layer in direct contact with the absorption layer, one or more high work-function contact regions in direct contact with the absorption layer, one or more low work-function contact regions in direct contact with the absorption layer, a gate electrode in direct contact with the dielectric layer and electrically connected to one of the contact regions, a first terminal connected to one of the one or more high work-function contact regions, a second terminal connected to one of the one or more low work-function contact regions, and a gate terminal connected to the gate electrode. FIGS. 6-8, 12A and 12B show exemplary embodiments having such elements. The solar cell devices are electrically connected in series wherein the gate terminal of at least one of the solar cell devices is electrically connected to one of the first and second terminals of another of the solar cell devices. FIGS. 10B and 10C show exemplary photovoltaic circuits configured in such a manner. It will be appreciated that the photovoltaic circuit may include additional elements, including additional solar cell devices that do not necessarily include the elements of the solar cell devices recited above. Structures as described above with respect of FIGS. 3, 5, 6-8, 12A, 12B and 15 may be incorporated within the photovoltaic circuits 10A-10C.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise indicated, words such as "top" and "bottom" refer to relative positions of elements as opposed to whether they are facing up or down.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A photovoltaic structure comprising:
   an intrinsic amorphous, nano-crystalline or microcrystalline absorption layer having a back side and a front side;
   a dielectric layer in direct contact with the front side of the absorption layer;
   one or more first contact regions having a first conductivity type in direct contact with the absorption layer;
   one or more second contact regions having a second conductivity type opposite to the first conductivity type and being in direct contact with the absorption layer, the one or more second contact regions and the one or more first contact regions being located on the back side of the absorption layer;
   a gate electrode in direct contact with the dielectric layer and electrically connected to one of the one or more first contact regions, a portion of the dielectric layer being positioned between the gate electrode and the absorption layer;
   a first terminal connected to the one of the one or more first contact regions that is electrically connected to the gate electrode, and
   a second terminal connected to one of the one or more second contact regions,
   the first and second contact regions, the absorption layer, the dielectric layer and the gate electrode being configured such that when light penetrates the absorption layer, charge carriers of a first type drift to the one of the one or more first contact regions electrically connected to the gate electrode and charge carriers of a second type drift to an interface region adjoining the dielectric layer where the electric potential for the charge carriers of the second type is lowered by an electric field induced by the gate electrode through the dielectric layer, the charge carriers of the second type functioning as a p-side of a p-i-n junction or an n-side of a n-i-p junction.

2. The photovoltaic structure of claim 1, wherein the absorption layer is an intrinsic hydrogenated amorphous, nano-crystalline or microcrystalline silicon semiconductor layer.

3. The photovoltaic structure of claim 2, wherein the dielectric layer comprises a-SiN$_x$:H, a-SiO$_x$:H, or combinations thereof.

4. The photovoltaic structure of claim 3, wherein the gate electrode is comprised of a transparent conductive oxide.

5. The photovoltaic structure of claim 1, wherein the absorption layer contains Si, Ge, C or combinations thereof.

6. The photovoltaic structure of claim 1, wherein the absorption layer, the one or more first contact regions, and the one or more second contact regions are comprised of hydrogenated amorphous silicon.

7. The photovoltaic structure of claim 1, wherein the gate electrode is comprised of a transparent conductive oxide.

8. The photovoltaic structure of claim 1, further including a power supply connected between the gate electrode and one of the contact regions.

9. A photovoltaic circuit comprising:
a plurality of solar cell devices, each solar cell device comprising:
an intrinsic amorphous, nano-crystalline or microcrystalline absorption layer having a back side and a front side;
a dielectric layer in direct contact with the front side of the absorption layer;
one or more first contact regions having a first conductivity type in direct contact with the absorption layer;
one or more second contact regions having a second conductivity type opposite to the first conductivity type and being in direct contact with the absorption layer, the one or more first contact regions and the one or more second contact regions being located on the back side of the absorption layer;
a gate electrode in direct contact with the dielectric layer and electrically connected to one of the one or more first contact regions, a portion of the dielectric layer being positioned between the gate electrode and the absorption layer;
a first terminal connected to one of the one or more first contact regions;
a second terminal connected to one of the one or more second contact regions, and
a gate terminal connected to the gate electrode, the first and second contact regions, the absorption layer, the dielectric layer and the gate electrode being configured such that when light penetrates the absorption layer, charge carriers of a first type drift to the one of the first contact regions electrically connected to the gate electrode and charge carriers of a second type drift to an interface region adjoining the dielectric layer where the electric potential for the charge carriers of the second type is lowered by an electric field induced by the gate electrode through the dielectric layer, the charge carriers of the second type functioning as a p-side of a p-i-n junction or an n-side of a n-i-p junction,
the solar cell devices being electrically connected in series and wherein the gate terminal of at least one of the solar cell devices is electrically connected to one of the first and second terminals of another of the solar cell devices.

10. The photovoltaic circuit of claim 9, further comprising a power supply electrically connected between the gate terminal of at least one of the solar cell devices and one of the first and second terminals of another of the solar cell devices.

11. The photovoltaic circuit of claim 9, wherein the absorption layer of one or more of the solar cell devices comprises an intrinsic amorphous hydrogenated silicon semiconductor layer.

12. The photovoltaic structure of claim 1, wherein the charge carriers of the first type are holes and the charge carriers of the second type are electrons.

13. The photovoltaic structure of claim 12, wherein the one of the one or more first contact regions electrically connected to the gate electrode includes a doped middle p+ region, the one or more second contact regions including first and second n+ regions, the doped middle p+ region being positioned between the first and second n+ regions, the gate electrode being electrically connected to the middle p+ region.

14. The photovoltaic structure of claim 1, wherein the charge carriers of the first type are electrons and the charge carriers of the second type are holes.

15. The photovoltaic structure of claim 14, wherein the one of the one or more first contact regions electrically connected to the gate electrode includes a doped middle n+ region, the one or more second contact regions including first and second p+ regions, the doped middle n+ region being positioned between the first and second p+ regions, the gate electrode being electrically connected to the middle n+ region.

16. The photovoltaic structure of claim 1, further including a gate via electrically connecting the gate electrode to the one of the one or more first contact regions.

* * * * *